United States Patent Office 3,559,107

Patented Jan. 26, 1971

3,559,107

AMPLIFIER SYSTEMS AND FET MODULATION

Martin J. Morgan, Rochester, William C. Evans, Brighton, Richard A. Rappaport, Henrietta, and Alfred N. Gutzmer, Webster, N.Y., assignors to Sybron Corporation, a corporation of New York Filed Oct. 9, 1967, Ser. No. 673,702
Int. Cl. H03c *1/54*
U.S. Cl. 332—47 16 Claims

ABSTRACT OF THE DISCLOSURE

A direct current voltage is applied to the gate electrode of an FET (field effect transistor) to modulate a carrier passing through the FET between its drain and source electrode. The carrier is an alternating current from a fixed amplitude source. The resistance between drain and source of the FET varies in accordance with the amplitude of the modulating voltage, hence, the carrier becomes amplitude modulated thereby. Bias voltage is applied to the FET's gate electrode at the value required for zero temperature coefficient operation of the transistor. Variation in the net gate bias due to the modulating voltage is substantially prevented by negative feedback of the amplified and demodulated carrier voltage to the gate electrode. Further temperature compensation is provided by a Zener diode made of the same semi-conductor material as the FET and incorporated in the supply of bias voltage. The bias voltage for zero temperature coefficient operation is determined by means of the relation $R_{ds}G_m=K$, where $R_{ds}$ is the value of the FET's drain-source resistance at the zero temperature coefficient point, $G_m$ is the FET's forward transfer transconductance and K is a constant having the value of about 0.184.

The present invention relates to carrier amplifier systems of the modulator-demodulator types, useful for measurement and process control purposes in response to low-level, direct current and low frequency signals. These signals are caused to vary the amplitude of a carrier—an alternating current signal of otherwise fixed amplitude. The thus-modulated carrier is amplified by AC-coupled amplifying means, and, usually, the amplified carrier is demodulated to produce a more or less high-level DC or low frequency signal corresponding to the original low-level signal. In such a system, the demodulating means is generally required to provide isolation between the low-level source, temperature stability, linearity, freedom from noise, and the like, to very high degree. In the prior art, various solid state modulators or equivalent have been proposed to satisfy these requirements.

The present invention relates to systems and modulators for such systems, wherein the modulating principle is variation of $R_{ds}$ of a field effect transistor (FET), wherein $R_{ds}$ is the channel resistance of the FET, that is, the resistance of the body of the FET between its drain and source electrodes. In the present invention, the gate electrode of the transistor is biased, both by the modulating signal and by an independent bias signal calculated to bias the FET for operation at its zero temperature coefficient point (ZTC).

In the invention, the ZTC point bias is determined from the relation $G_mR_{ds}=K$, wherein $G_m$ is the forward transfer transconductance of the FET, and K is a constant.

The FET is connected to a fixed amplitude AC source, the arrangement being that AC from the source flows through $R_{ds}$. This AC is therefore the carrier and variations in $R_{ds}$ modulate its amplitude. The modulated carrier is amplified by a more or less high gain AC-coupled amplifier, the output signal of which is demodulated and, among other things, is fed back to the gate of the FET so as to maintain its bias at the ZTC value thereof, despite variations caused by the modulating signal. As a result, the modulator provides extremely high isolation because of the FET, and high stability and linearity because of the ZTC bias and of the negative feedback. The temperature stability is further improved by incorporating in the bias supply a Zener diode made of the same basic semi-conductor material as the FET.

Figure 1:
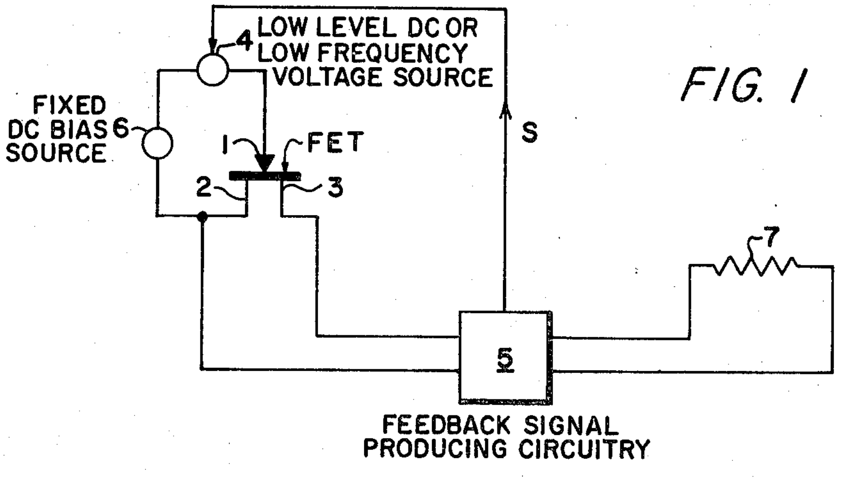
FIG. 1 is a circuit diagram illustrating basic principles involved in the invention.

In FIG. 1, a field effect transistor, denoted as FET, has gate, source and drain electrodes 1, 2 and 3, respectively, the gate being P-type. A low-level DC or low frequency voltage source 4 in series with a fixed DC bias source 6 controls $R_{ds}$ of the FET, and circuitry 5 monitors $R_{ds}$. Circuitry 5 may be supposed to be any suitable instrumentality capable of producing a feedback signal *s* representing deviation of $R_{ds}$ from its ZTC value, $R_b$, say, and such that when applied to the source 4, causes it to make the net voltage, $V_{gs}$, across gate electrode 1 and source electrode 2, that necessary to make the value of $R_{ds}$ substantially $R_b$. Circuitry 5, evidently, will reflect the deviation of the sum of the voltages of source 4 and source 6 from the value necessary to make $R_{ds}$ equal to its ZTC value and, hence, will provide a measure of the voltage of source 4, since the voltage of source 6 remains fixed.

According to the invention, circuitry 5 operates by comparing $R_{ds}$ to resistor 7 whose value is $R_b$, the ZTC value of $R_{ds}$.

Figure 2:
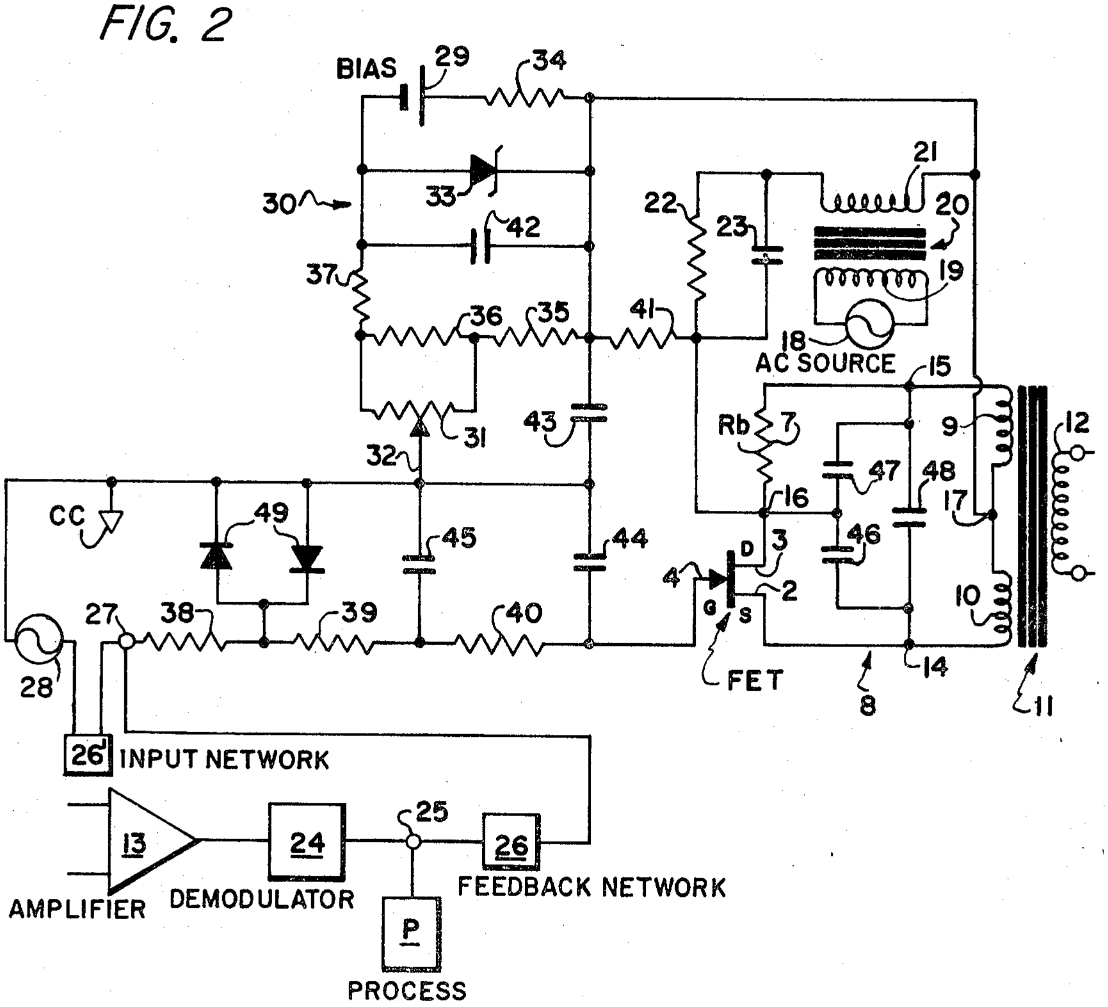
FIG. 2 is a circuit diagram of a carrier amplifier system according to the invention.

According to the present invention, and as shown in FIG. 2, circuitry 5 is a bridge 8 having the FET and resistor 7 as adjacent arms, the other two arms of the bridge being the two halves 9 and 10 of the primary winding of a transformer 11, whose secondary winding 12 is connected to the input of an amplifier 13. Source electrode 2 and one end of winding 8 are connected together at a terminal 14, and one end of resistor 7 and one end of winding 9 are connected together at a terminal 15, the voltage across winding 12 being, in effect, the voltage across terminals 14 and 15.

Drain electrode 3 and the other end of resistor 7 are connected together at a terminal 16, and a terminal 17 connects the two halves of windings 9 and 10 together. Winding halves 9 and 10, of course, are wound in opposition to each other.

Terminals 16 and 17 provide for energizing the bridge from an AC source 18, in series with the primary winding 19 of a transformer 20, whose secondary winding 21 is connected at one end via a resistor 22 and a capacitor 23, in parallel with each other, to terminal 16, whereas the other end of winding 21 is connected to terminal 17.

As is usual with bridges, if the impedance between terminals 14 and 16 is the same as between terminals 15 and 16, and the impedance between terminals 14 and 17 is the same as between terminals 15 and 17, the net voltage across terminals 14 and 15 will be zero. In the present case, only the resistance $R_{ds}$ between electrodes 2 and 3 is presumed to vary, hence, any voltage other than zero across terminals 15 and 14 is a measure of the difference between the value of resistor 7 and $R_{ds}$. Further, this difference will have a phase with respect to that of source 18, depending on the sense of the difference. Accordingly, the voltage across winding 12 is a measure of the difference, and will have a phase opposite to or the same as that of source 18, depending on the sense of the difference.

Amplifier 13 amplifies the voltage across winding 12, producing a corresponding voltage of larger magnitude which is demodulated by a demodulator 24, which produces a positive or negative voltage at its output terminal 25. Feedback network 26 provides a corresponding current to a terminal 27. A source 28 of modulating voltage causes current to be applied to terminal 27 via an input network 26'. The voltage at terminal 27 determines the voltage $V_{gs}$ of the FET, and, therefore $R_{ds}$. The effect of feedback is to make the currents to terminal 27 sum to zero so that $V_{gs}$ will have a value determined by a bias network 30, as will be described later. The current summing effect is, of course, dependent on the high impedance the FET presents to terminal 27.

It is to be supposed that if the voltage at terminal 27 is zero, than $V_{gs}$ has the value required to make $R_{ds}$ equal to $R_b$. Thus, the bridge 8 is then balanced and the FET is operating under ZTC conditions. It is next to be supposed that if the voltage at terminal 27 becomes other than zero, then the voltage at terminal 25 changes so as to cause the current-sum at terminal 27 to become zero again. This latter voltage naturally appears because $R_{ds}$ has changed and thereby unbalanced the bridge. Amplifier 13 is provided with sufficient gain, and the impedance of network 26 is so proportioned that the current to terminal 27 via network 26 returns the voltage at terminal 27 to practically the value it had when the bridge was stated originally to be balanced. As will be understood by those familiar with the principles of feedback systems, if the voltage at terminal 27 changes in a negative direction, a positive-going feedback current will be elicited from network 26, and, again, return the voltage at terminal 27 to a value at which bridge 8 is balanced.

The voltage at terminal 27 consists of three components, one of which provides the value of $V_{gs}$ needed to bias the FET to its ZTC point. Current from the source 28 causes an impedance 26 to provide a second component that unbalances bridge 8, and the network 26 provides the third component, which substantially cancels the second component, thereby rebalancing bridge 8. While the $V_{gs}$ component might be provided by source 28, that is, its voltage would have a value corresponding to the ZTC value of $V_{gs}$ plus or minus a value corresponding to the aforesaid second component, this last originates in a bias voltage source 29, represented in FIG. 2 as a battery. Source 29 is part of a bias network 30 including a potentiometer 31 having a slider 32 connected to circuit common CC. The slider 32 is set, of course, to adjust $V_{gs}$ initially. In addition, the network includes a Zener diode 33, provided for temperature compensating purposes.

It appears that what has been termed herein the ZTC point of the FET is but one of an infinite number of ZTC points. The usual concept of "the" ZTC point is that it is determined by the intersection of FET's transfer characteristic curves at various temperatures. Actually, there seems to be not a point of intersection, but a region of intersections. As "the" ZTC point is most conveniently measured by measuring the transfer characteristics at two different temperatures, ZTC operation is obtained only at these two temperatures. At intermediate temperatures, there is a shift of the ZTC point. According to the invention, Zener diode 33 compensates for this shift since it has temperature-sensitive characteristic analogous to ZTC point shift of the FET, which varies in approximately the same non-linear manner. The physical layout of the circuit at FIG. 2 would in practice be such as to subject diode 33 to the same temperature influences as the FET is subject to, and the network 30 is proportioned so that as the temperature-sensitive characteristics of diode 33 varies in the same non-linear manner as the ZTC point of the FET, the voltage at slider 32 varies in a sense and amount sufficient to substantially nullify the ZTC point shift.

It will be recalled that the ZTC conditions obtain when the gate to source bias voltage, $V_{gs}$, has such value that the drain current, $I_d$, is unaffected by variations in the temperature of the FET. Let $I_d$ versus $V_{gs}$ be plotted for a predetermined, fixed drain to source voltage, $V_{ds}$, with the FET temperature held at some given constant value. Let such plot be repeated, but at a different constant value of FET temperature, and let the two plots be made on the same set of coordinate axes, beginning with the same value, $V_{gs}$. The two plots will intersect, and the value of $V_{gs}$ at which the plots intersect, is a ZTC value of $V_{gs}$.

In practice, the ZTC values of $V_{gs}$ for FET's having P-type silicon bodies, falls in the range −0.7 to −2.8 volts, a range of 2.1 volts extent. However, it is desirable to determine the above-mentioned intersection to an accuracy of 1 millivolt, and to do so with commercially available automatic plotting equipment. As it happens, in order to so obtain one millivolt accuracy, it is necessary to restrict the plot to a 200 millivolt range. Thus, the typical XY-recorder will provide a plotted range of about ten inches maximum in one coordinate direction, (and usually somewhat more in the other). This is too short for a 2.1 range of $V_{gs}$ to provide one millivolt accuracy in reading $V_{gs}$ off the sheet of chart paper on which the plot is made, since one inch of plot would correspond to about 200 millivolts, and as a practical matter, no reading or length measurement on the chart can be made with accuracy better than the 0.05 inch (corresponding to 10 millivolts on a plot of 2.1 volts range). Accordingly, it is necessary to make the plotting range of 10 inches correspond to 200 millivolts change in $V_{gs}$. Likewise, $I_d$ should have a range of about 20 microamperes for seven inches of plotting range.

Of course, each FET could be plotted twice: once over a 2.1 volt range to get the approximate ZTC value of $V_{gs}$ and one on a shorter range including the approximate value (actually making four plots in all, since each determination of a ZTC value of the $V_{gs}$ requires two plots, one at one temperature, and one at another temperature).

According to the invention, relation $G_m R_{ds} = K$ provides a way of eliminating the approximate determination of the ZTC value of $V_{gs}$, and at the same time, of determining the value $R_b$ needed in the modulator circuitry for, in effect, measuring deviations in $R_{ds}$ of the FET.

Knowing K, which is empirically determined from measurements of FET's operating under ZTC conditions, $G_m$ is measured as the change in $I_d$ as $V_{gs}$ is varied over a predetermined range. Thus, $I_d$ and $V_{gs}$ move the stylus of an XY recorder in the Y and X directions, respectively. The slope of the plot is measured and taken as $G_m$, allowing a value of $R_{ds}$ to be computed from said relation. This value of $R_{ds}$, however, is a ZTC value and, of course, the value of $R_b$, also.

The value of K is crucial. Surprisingly, it appears that FET's having overall specifications suitable for modulator use do not vary in K significantly from manufacturer to manufacturer. However, it also appears that the value of K depends on whether or not AC operation is involved. Specifically, for AC circuitry, as in FIGS. 2 and 3, K may be taken as 0.184. If a system of FIG. 2 type is permitted an overall error of ½%, then the $R_b$ and $V_{gs}$ values for ZTC operation determined using $K = 0.184$ are 99% reliable. That is to say, only 1 out of 100 systems having modulators with circuit constants based on $K = 0.184$ may be expected to fall outside the overall system tolerance on account of the modulator. This confidence level, incidentally, allows for human operator error in determining $V_{gs}$ and $R_b$, error in testing equipment used (e.g., that of FIG. 3), as well as for deviant FET's. Otherwise stated, $K = 0.184$ provides for determination of a ZTC value of $V_{gs}$ to an accuracy of 1.5 millivolts DC.

The first step in determining ZTC conditions for a given FET is to measure $G_m$, using the following relationship:

$$I_d = G_m \Delta V_{gs} \quad (1)$$

where $I_d$ = change in drain current for a given change in $V_{gs}$ $\Delta V_{gs}$=change in $V_{gs}$, typically 0.1 to 3.0 volts in order to get $I_d$ to change through the range of about 45 to 80 microamperes.

Figure 3:
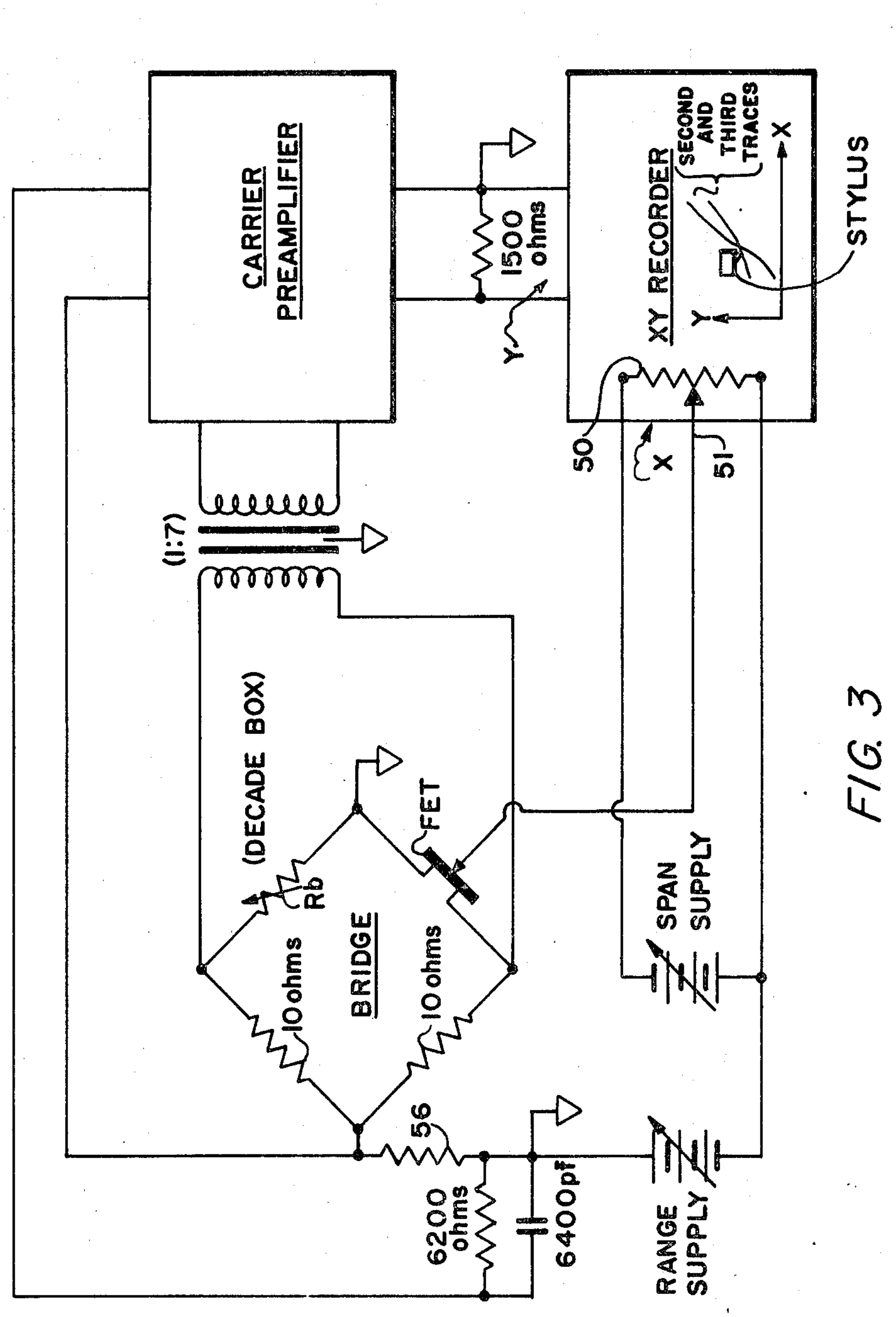
FIG. 3 is a circuit diagram of testing equipment useful for practicing the invention.

Apparatus such as shown in FIG. 3 is preferably used in the above determination. Thus, the carrier amplifier depicted in FIG. 3 is of synchronous modulator-demodulator type, and its carrier source provides excitation for the measuring bridge via the network consisting of the 56 and 6200 ohm resistors and the 6400 pf. capacitor. The DC output voltage of the carrier amplifier across the 1500 ohm resistor provides the *y* signal for the *xy* recorder depicted. The recorder's *x* drive, however, is from a fixed speed motor which also drives the slidewire 50 so that a slider 51 picks off an *x*-proportional ramp voltage off slidewire 51 which is applied to the FET as $V_{gs}$. This *x* voltage is from the span supply which is adjusted so that $V_{gs}$ varies as required by the conditions of Equation 1, supra. The decade box, which provides $R_b$, is set to 10,000 ohms, a value somewhat larger than $R_b$ will ordinarily have under ZTC conditions.

When the recorder is turned on, its stylus will move to the right and upward, thereby making a trace like one of those depicted in FIG. 3. At any given instant the position of the stylus on the depicted *x* and *y* axes will give the $I_{ds}$ and $V_{gs}$ of the FET then obtaining.

The FET being tested is conditioned to a standard temperature such as 60° F., and the *xy*-trace is run beginning with $V_{gs}$=100 millivolts. From this trace, its slope is computed or measured with a suitable template, giving, as Equation 1 indicates, $G_m$, or in the latter case, $R_b$ for ZTC directly because $G_m$ divided by 0.184 is equal to $R_b$ and the template can be so marked off, instead of in $G_m$.

This computed value of $R_b$ is now set off on the decade box, and the previous process is repeated, the temperature being maintained at 60° F. However, the bias supply is adjusted so that the *x*-movement of the stylus will create a total change in $V_{gs}$, of 200 millivolts, instead of 2.9 volts. Following this, the temperature of the set-up is increased to, say, 140° F., and the second plot repeated, using again the computed value of $R_b$, 200 millivolts change in $V_{gs}$, and the same piece of *xy* chart, and starting the third trace at the same *x* value as the second trace started at.

The second and third traces will intersect and the value of $V_{gs}$ at this intersection will be a ZTC value for $V_{gs}$. The gate voltage of the FET is now set to this value of $V_{gs}$ and the bridge is balanced by varying decade box resistance. Ordinarily, the value of this balancing resistance is a more exact value of $R_b$, hence the resistor 7 will be chosen to have the value of the balancing resistance rather than the predicted value. Also, the $V_{gs}$ change utilized in the foregoing procedure may be as low as 80 millivolts, for somewhat more precision than the 200 millivolts specified in the foregoing.

Where the additional temperature stabilization of diode 33 is used, the modulator may be brought to 60° F. or 140° F. before setting $V_{gs}$ for the reason that, as pointed out before, the intersection of $V_{gs}$ is strictly correct at only those temperatures, and so $V_{gs}$ must vary therefrom in between by the Zener diode's effect on the source of $V_{gs}$, in order to be a correct ZTC value. The temperatures referred to define the temperature range to which the modulator is expected to be exposed, in use, and are purely examplary, therefore.

In actual production, the FET's are not individually processed. Rather, a batch of FET's will be switched in and out of the measuring bridge of FIG. 3, one after another, and the described first trace will be made for each one of them before going on to the next stages, $R_b$ next determined for each, then the second trace for each and, finally, the third trace for each. The computed $R_b$ for each FET is, of course, switched in and out of the bridge with the corresponding FET. The second and third trace for each FET is made one on top of the other, but otherwise each trace is made on chart area separate from all the rest.

By way of example, basic equipment suitable for use in determining ZTC values for FET's may include a Sanborn Model 350–1100c carrier preamplifier and a Houston Omnigraphic Model 6521 XY recorder. The former consists essentially of a modulator, AC amplifier and demodulator, including an internal oscillator providing a sinusoidal 2.4 kilocycle per second oscillation which is used to excite the FET bridge, and is coupled to the bridge output by a 1:7 transformer, which steps up the unbalance signal from the bridge.

The legendry of FIG. 3 and the previous explanation of its use makes the figure largely self-explanatory. In addition, the 56 ohm resistor fixes the bridge excitation at 56.4 millivolts, R.M.S., ±5% and the 6200 ohm resistor and the 6400 picofarad capacitor provide phase correction. The 2.4 kc. from the internal oscillator (not shown) of the carrier amplifier also excites its modulator and demodulator.

The range supply provides zero-setting voltage which is variable to allow making a particular voltage value correspond to a given point on the X-travel of the recorder stylus. Not shown are the provisions for switching the FET's and resistances for batch processing purposes.

Other equipment may be used, and should obviously correspond to the examples given supra in electrical characteristics and quality. In addition, for best results, it is necessary that the bridge be excited by an AC source very similar to that which will be used with the modulators incorporating the processed FET's. In the present case, the internal oscillator of the specific carrier amplifier, as manufactured, provides such excitation, when used with the 56 and 6200 ohm resistors, and the 6400 pf. capacitor.

The invention, as described thus far, is not restricted to bridge-type systems, nor to modulators. Those skilled in the art will find no difficulty in extending the procedures described above to determining ZTC values for FET's to be used in other types of circuitry. It is preferable to undertake such determination in testing circuitry resembling the circuit for which the FET is intended, insofar as currents and voltages acting on the FET are concerned.

The circuitry of FIG. 2 is particularly suited to the use of the FET as a modulating device and certain features thereof partake of patentable novelty in the present invention, which will now be considered in terms of the particulars of an actual example, for which the following is a parts list:

FET, Texas Instrument—TIS14

Diodes:
- 33—IN752–A
- 49—1N458

Potentiometer 31—20,000 ohms

Resistors:
- 22—6,200 ohms
- 34—604 ohms
- 35 (typical value)—734 ohms
- 36—2,780 ohms
- 37 (typical value)—6,830 ohms
- 38—27,000 ohms
- 39—27,000 ohms
- 40—1,000,000 ohms
- 41—56 ohms
- 7 (typical value)—1,015.0 ohms Capacitors:
- 42—1 microfarad, 35 v.
- 43—1 microfarad, 35 v.
- 44—1 microfarad, 35 v.
- 45—750 picofarads
- 46 (typical range of value)—0–30 picofarads
- 47 (typical range of value)—0–30 picofarads
- 48 (typical value)—9,200 picofarads
- 23—150 picofarads The oscillator 18 and transformer 20 provided 22 volts, peak to peak across winding 21. This provided 200 millivolts, peak to peak, across the bridge 8, leading the oscillator by 30°. The attenuation is due to resistor 22 and the phase lead, to capacitor 23. According to the invention, resistor 41, which is in parallel to the bridge resistance and whose voltage drop provides the excitation voltage across the bridge, is much smaller than the source resistance (represented mainly by resistor 22) across it, thereby providing for changing attenuation and phase angle independently of one another, as long as the paralleled resistance of resistor 41 and the bridge remain much smaller than the source resistance. Thus, one may vary the value of capacitor 23 without affecting the bridge excitation voltage magnitude, or one can vary resistor 41 to change the excitation voltage magnitude without affecting its phase angle. The phase lead is provided primarily to offset phase lag of the bridge. However, the described relation between source resistance and the said paralleled resistance also makes the excitation of the bridge relatively insensitive to bridge changes.

Capacitors 46, 47 and 48 are provided for the purpose of quadrature balance, and capacitor 48 provides fine phase adjustment with respect to capacitor 23. Only one of capacitors 46 and 47 is ever necessary.

The bias source, shown as battery 29, would ordinarily be the output voltage of a suitable rectified AC power supply. This voltage is regulated by Zener diode 33 to 5.2 volts, plus or minus 5%, and according to the invention, poth the diode 33 and the FET are silicon semiconductor devices, whereby this regulated voltage also varies with temperature in the same fashion as the ZTC voltage of the FET, and thereby compensates for temperature shift in this voltage.

Capacitor 42 has the usual function of a filter capacitor. Resistors 35 and 37 vary according to the range of FET bias, being selected for different parts of said range. Potentiometer 31 provides fine adjustment of bias.

Source 28 is normally a DC source whose voltage may contain noise or other fluctuations, generally of relatively high frequency, which it is preferable to eliminate by means of an input filter system consisting of the resistors 38, 39 and 40, which couple one side of the source voltage to the FET gate, capacitors 44 and 45, and diodes 49. The capacitors by-pass high frequency components, whereas the diodes limit the amplitude of the source voltage. Capacitor 43 and resistor 41 couple the other side of the source voltage to the FET drain. Gate bias is applied through source 28, from one side of the bias source, namely, slider 32, there being direct connection of the FET drain to the other side of the bias source via resistor 41.

The "typical value" notations in the above parts list signify such component values as are most likely to vary from example of the system of FIG. 2. The remainder of the components, in practice, remain as given in the parts list. As the parts list shows, too, various FET's can be utilized in the modulator. It is not necessary to select them for any particular property, i.e., if the manufacturer's specifications indicate that a given type of FET would be suitable, ordinary production-run lots of transistors of that type will generally be satisfactory. Generally speaking, for best ZTC determination the type of transistor used should be one whose $G_m$ is substantially constant over the range of voltages and currents involved in the above-described testing procedures. Insofar as modulation is concerned, the linearity and value of $G_m$ is not important. Preferably, specified variation in pinch-off voltage from unit to unit should be relatively small, since variation in $V_{gs}$ from unit to unit will then be correspondingly small. $V_{gs}$ is a function of bias supply component values, such as the Zener voltage of diode 33, and if $V_{gs}$ varies too much, it is difficult to standardize on bias supply components. Low leakage to the FET channel is also desirable. Under these conditions, drain and source symmetry is unimportant and the FET operates as a nearly linear voltage-controlled resistor. With feedback via feedback loop 26, therefore, the modulator output can deviate from linear relation to its output by much less than ½%.

The voltages referred to, including the feedback voltage, are all with reference to a circuit common, such as indicated at CC. This is purely for purposes of illustration, as in practice, low level portions of the system of FIG. 2 will be isolated by various shielding and separate grounding expedients from the rest of the system. Thus, the modulator as such may float with respect to the rest of the system, and so on. As features such as these are often applied to a low level system, they have not been described herein, and are deemed within the scope of the present invention for one skilled in the art to provide, if needed, without departure from the present invention.

Again modulators and systems using same have varied and extensive utility in the prior art, being particularly suitable for transforming low-level signals to relatively high levels while isolating the former from the apparatus receiving the modulator output. Thus, in the present example, the detailed circuitry of FIG. 2 hereof provided the modulator of a process control system such as shown in FIG. 2 of copending application S.N. 414,942, filed Nov. 25, 1964, in the name of Charles H. Gebo and assigned to the assignee of the present invention. The Gebo system utilizes a discriminator D, not shown in present FIG. 2, since the need therefor depends on the nature of the demodulator 26. For example, demodulator 24 could be full-wave phase-sensitive, in which case the discriminator D would not be required. Also, the process P of Gebo's FIG. 2, which would connect, in effect, to present terminal 25, influences source 28 to change the balance of current at terminal 27, by reason of arrangements more fully shown in Gebo's FIG. 2. Indeed, the combination of modulator-amplifier-demodulator is a DC amplifier suitable as a component of a large variety of process control systems, such as disclosed, for example, in Pat. No. 3,127,105 to N. B. Nichols, assigned to the assignee of the present invention. Thus, the amplifier O of Nichols is designed to produce a DC output from a DC input. This, however, is one well-known use of modulator demodulator amplifying systems, such as our invention provides. In other systems, the demodulator output operates an indicator or the like, merely to exhibit a measure of the voltage of source 28.

The foregoing description is to be construed as illustrative only, as various uses and modifications of the invention disclosed therein will occur to those skilled in the art that do not depart from the spirit and scope of the invention as claimed hereinbelow.

Having set forth our invention as required by USC, Title 35, we claim:

1. A modulator comprising a field effect transistor, an amplifier, circuitry interconnecting said transistor and said amplifier, and feedback means; said circuitry being effectively responsive to $R_{ds}$ of said transistor such as to produce a signal representative of the deviation of said $R_{ds}$ from a given value; said amplifier being responsive to said signal to produce a voltage representative of said signal; said feedback means connecting said voltage to the gate electrode of said transistor, said feedback means and said amplifier being constructed and arranged such that said voltage varies $V_{gs}$ of said transistor in such fashion as to oppose deviation of $R_{ds}$ from said given value, and there being bias means connected to said gate electrode for applying bias voltage thereto at a value independent of said signal; $R_{ds}$ meaning resistance between drain and source, and $V_{gs}$ meaning voltage between gate and source.

2. The modulator of claim 1, including an AC source, said AC source being connected to said transistor such as to cause AC from said source to flow through $R_{ds}$; said circuitry being constructed and arranged to provide said signal in accordance with current flow through $R_{ds}$, and said AC source providing said AC at a voltage fixed independently of said signal.

3. The modulator of claim 1, including a $V_{gs}$ source constructed and arranged to provide $V_{gs}$ to said gate electrode in accordance with the relation $G_m R_b = K$, wherein $G_m$ is the mutual conductance of said transistor, $R_b$ is said given value, and K is a constant, $R_b$ also being the value of $R_{ds}$ when $V_{gs}$ has a value such as to bias said transistor to zero temperature coefficient condition.

4. The modulator of claim 3, including an AC source, said AC source being connected to said transistor such as to cause AC from said source to flow through $R_{ds}$; said circuitry being constructed and arranged to provide said signal in accordance with current flow through $R_{ds}$; said transistor being of the type having a silicon body electrically connected to the transistor's drain and source electrodes and electrically connected to said gate electrode, and wherein K has the value 0.184, substantially, and said AC source providing said AC at a voltage fixed independently of said signal.

5. The modulator of claim 1, wherein said circuitry is a bridge; said bridge having $R_{ds}$ as one arm and a resistance of said given value as another arm, the arrangement being that said bridge produces said signal in proportion to the difference between $R_{ds}$ and said given value, said resistance of said given value being of the kind wherein resistance is independent of the voltage applied thereto.

6. The modulator of claim 5, wherein said circuitry includes a source of excitation arranged to produce equal current flow through said arms when $R_{ds}$ is equal to said given value, and said bridge is arranged to produce said signal in proportion to the difference between current flow through $R_{ds}$ and current flow through said resistance, said source of excitation providing said current flow at a voltage fixed independently of said signal.

7. A zero temperature coefficient, field effect transistor circuit comprising a field effect transistor, a $V_{gs}$ source connected across the gate and source of said transistor, and an $I_{ds}$ source connected across the drain and source of said transistor; said $V_{gs}$ source being constructed and arranged to apply a DC value of $V_{gs}$ across the gate and source of said transistor such that $G_m R_{ds} = K$, $V_{gs}$ meaning voltage between gate and source, $I_{ds}$ meaning current between drain and source, $G_m$ meaning mutual conductance, and K meaning a numerical constant.

8. The zero temperature coefficient, field effect transistors circuit of claim 7, wherein $K = 0.184$ and $I_{ds}$ is AC.

9. The zero temperature coefficient, field effect transistor circuit of claim 7, in combination with feedback means responsive to changes in $R_{ds}$ and constructed and arranged to vary $V_{gs}$ in opposition to such changes in $R_{ds}$.

10. The zero temperature coefficient, field effect transistor circuit of claim 9, wherein $K = 0.184$ and $I_{ds}$ is AC.

11. The zero temperature coefficient, field effect transistor circuit of claim 7, including a Zener diode of the same semi-conductor material as said transistor, said diode being connected across said source of $V_{gs}$ for regulating $V_{gs}$ in accordance with its Zener voltage, said transistor and said diode being subject to substantially the same temperature.

12. A field effect transistor circuit, including a bridge circuit having four impedances, one of which is the drain-source resistance of said FET, the respective said impedances defining the respective arms of the bridge, one pair of said impedances each having the same value, and the other pair of said impedances each having the same value, bias means and a signal source each providing a voltage, and each such voltage being applied to the gate electrode of said transistor, such as to balance said bridge; means constructed and arranged to respond to unbalance of said bridge by producing a feedback voltage of such sense and magnitude that if it be applied to said gate electrode it will change said drain-source resistance enough to cause said bridge to be balanced, and means applying said feedback voltage to said electrode.

13. The field effect transistor circuit of claim 12, wherein the value of the other impedance of the said pair including said drain-source resistance is a resistance having a value corresponding to a ZTC point of said transistor, the last said resistance being of the kind wherein resistance is independent of the voltage applied thereto, and ZTC meaning zero temperature coefficient.

14. The field effect transistor circuit of claim 13, wherein the bridge is arranged to be excited by an AC source, and the value of the last said resistance is given by $G_m R_b = 0.184$, where $G_m$ is the transconductance of said transistor, and $R_b$ is the value of said last said resistance.

15. The field effect transistor circuit of claim 13, wherein said bias means includes a Zener diode, the Zener voltage drop across said diode providing bias voltage to said gate electrode; said diode being such that said voltage varies with temperature as does the ZTC point of said transistor, and said diode and said transistor being subject to substantially the same temperature.

16. The field effect transistor circuit of claim 12, wherein said one pair of impedances includes said transistor and said other pair are the two input winding halves of a transformer having an output winding, said transformer being constructed and arranged such that the voltage across said output winding has a sense and magnitude corresponding to the difference and the sense thereof between the currents in said input winding halves.

References Cited

UNITED STATES PATENTS

| | | | |
|---|---|---|---|
| 3,100,286 | 8/1963 | Jones | 332—147X |
| 3,281,718 | 10/1966 | Weberg | 332—31(T) |
| 3,397,353 | 8/1968 | Hitt et al. | 332—31(Tux) |
| 3,432,774 | 3/1969 | Fick | 331—110X |
| 3,435,375 | 3/1969 | Miller | 307—251X |
| 3,457,435 | 7/1969 | Burns et al. | 307—251 |

ALFRED L. BRODY, Primary Examiner

U.S. Cl. X.R.

307—205, 251, 304; 331—110; 332—37